United States Patent [19]
Segawa et al.

[11] Patent Number: 6,100,766
[45] Date of Patent: *Aug. 8, 2000

[54] CORRECTION CIRCUIT CONTROLLING SENSITIVITIES OF AN OSCILLATOR CIRCUIT AND ELECTRONIC DEVICE USING THE SAME

[75] Inventors: Yuji Segawa; Kunihiko Gotoh, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/971,677

[22] Filed: Nov. 17, 1997

[30] Foreign Application Priority Data

May 16, 1997 [JP] Japan ................................. 9-127587

[51] Int. Cl.[7] ............................. H03B 5/24; H03K 7/08; H03K 7/085; H03K 7/099
[52] U.S. Cl. .................................. 331/2; 331/1 A; 331/8; 331/17; 331/25; 331/34; 331/179; 327/147; 327/150
[58] Field of Search ...................... 331/1 A, 2, 8, 331/17, 25, 34, 179; 327/147–150, 156–159

[56] References Cited

U.S. PATENT DOCUMENTS

| | | |
|---|---|---|
| 4,654,604 | 3/1987 | Smith et al. .......................... 331/2 X |
| 4,667,168 | 5/1987 | Shiomi et al. ........................ 331/1 R |
| 5,043,677 | 8/1991 | Tomassetti et al. ..................... 331/2 |
| 5,182,528 | 1/1993 | Zuta ................................. 331/1 A |
| 5,410,510 | 4/1995 | Smith et al. .......................... 365/201 |
| 5,446,416 | 8/1995 | Lin et al. ............................ 331/11 |
| 5,517,159 | 5/1996 | Hwang ............................... 332/127 |
| 5,543,754 | 8/1996 | Onodera ............................. 331/25 |
| 5,777,520 | 7/1998 | Kawakami ......................... 331/1 R |

FOREIGN PATENT DOCUMENTS

| | | |
|---|---|---|
| 63-37717 | 2/1988 | Japan . |
| 3-137711 | 6/1991 | Japan . |
| 4-137914 | 12/1992 | Japan . |

*Primary Examiner*—David Mis
*Attorney, Agent, or Firm*—Armstrong, Westerman, Hattori, McLeland & Naughton

[57] ABSTRACT

A correction circuit for controlling a correction required circuit includes an oscillator circuit, and a logic circuit which counts an oscillation frequency of the oscillator circuit and thus produces a control signal which causes the oscillator circuit to oscillate at a constant frequency. The control signal changes element values of elements of the oscillator circuit and the correction required circuit so that characteristics of the oscillator circuit and the correction required circuit can be controlled.

12 Claims, 10 Drawing Sheets

$$T \alpha \frac{(Vrh-Vrl) \cdot R \cdot C}{Vin}$$

OSCILLATION CYCLE $$f_c = \frac{1}{2\pi RC}$$

FIG. 7A

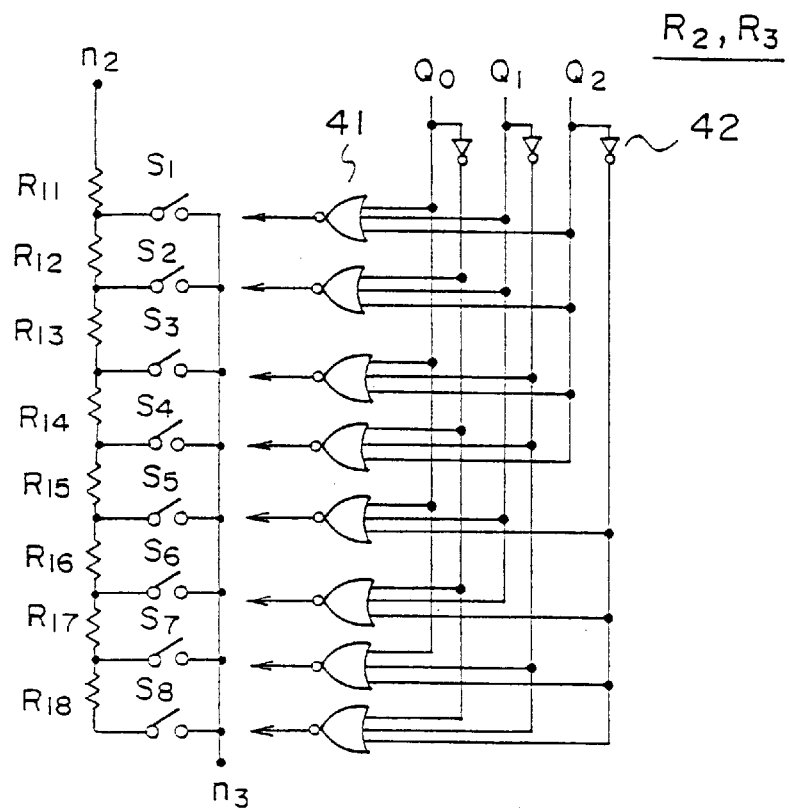

FIG. 7B

| $Q_2$ | $Q_1$ | $Q_0$ | $S_1$ | $S_2$ | $S_3$ | $S_4$ | $S_5$ | $S_6$ | $S_7$ | $S_8$ | RESISTANCE VALUE |
|---|---|---|---|---|---|---|---|---|---|---|---|
| 0 | 0 | 0 | (ON) | OFF | OFF | OFF | OFF | OFF | OFF | OFF | $R_{11}$ |
| 0 | 0 | 1 | OFF | (ON) | OFF | OFF | OFF | OFF | OFF | OFF | $R_{11}+R_{12}$ |
| 0 | 1 | 0 | OFF | OFF | (ON) | OFF | OFF | OFF | OFF | OFF | $R_{11}+R_{12}+R_{13}$ |
| 0 | 1 | 1 | OFF | OFF | OFF | (ON) | OFF | OFF | OFF | OFF | $R_{11}+R_{12}+R_{13}+R_{14}$ |
| 1 | 0 | 0 | OFF | OFF | OFF | OFF | (ON) | OFF | OFF | OFF | $R_{11}+R_{12}+R_{13}+R_{14}+R_{15}$ |
| 1 | 0 | 1 | OFF | OFF | OFF | OFF | OFF | (ON) | OFF | OFF | $R_{11}+R_{12}+R_{13}+R_{14}+R_{15}+R_{16}$ |
| 1 | 1 | 0 | OFF | OFF | OFF | OFF | OFF | OFF | (ON) | OFF | $R_{11}+R_{12}+R_{13}+R_{14}+R_{15}+R_{16}+R_{17}$ |
| 1 | 1 | 1 | OFF | OFF | OFF | OFF | OFF | OFF | OFF | (ON) | $R_{11}+R_{12}+R_{13}+R_{14}+R_{15}+R_{16}+R_{17}+R_{18}$ |

# CORRECTION CIRCUIT CONTROLLING SENSITIVITIES OF AN OSCILLATOR CIRCUIT AND ELECTRONIC DEVICE USING THE SAME

BACKGROUND OF THE INVENTION

1. Field of the Invention

The present invention generally relates to a correction circuit which controls parameters of a circuit to be corrected by utilizing an oscillation frequency of an oscillator circuit.

A voltage-controlled oscillator (VCO) is applied to various electronic devices such as portable radio communication devices and modems. Examples of portable devices are telephone sets, mobile telephone sets and cordless telephone sets. More particularly, the VCO is used for, for instance, frequency tuning, signal detection, data reproduction and clock reproduction. In many cases, the VCO is used together with a filter. It is required that the VCO and filter have a high precision level. The VCO which does not have a high precision will not oscillate an expected frequency even if a designed voltage is applied thereto. If the filter does not have a high precision, the selectivity thereof will be degraded.

Normally, the VCO and filter include a resistor and a capacitor. Hence, the precision of the VCO and filter, in other words, the characteristic thereof depends on the absolute precision of the circuit components (elements) such as a resistor and capacitor. Generally, the higher the precision, the more expensive the circuit components. Hence, use of highly precise circuit components is not a practical solution to obtain a given characteristic.

The present invention is directed to providing a correction circuit which makes it possible to realize a given circuit characteristic even if the circuit components have different precision levels.

2. Description of the Related Art

FIG. 1A is a circuit diagram of a conventional VCO. An input voltage Vin is converted into a current I (=Vin/R) by means of a voltage/current converter circuit made up of an operational amplifier 10, a P-channel MOS transistor 11 and a resistor R. A voltage equal to the gate voltage of the transistor 11 is applied to the gates of P-channel MOS transistors 12 and 14, and is thus ON. The above gate voltage is the output voltage of the operational amplifier 10. N-channel MOS transistors 13 and 15 form a current-mirror circuit. Thus, if the transistors 13 and 15 have an identical size, the same amount of currents as that of the current flowing in the transistor 11 will flow in the transistors 13 and 15.

A node n1 is connected to a capacitor C, the inverting input terminal of an operational amplifier 16, and the non-inverting input terminal of an operational amplifier 17. At the node n1, the drains of the transistors 14 and 15 are connected together. The non-inverting input terminal of the operational amplifier 16 is supplied with a high-level reference voltage Vrh. The inverting input terminal of the operational amplifier 17 is supplied with a low-level reference voltage Vrl. The operational amplifiers 16 and 17 respectively function as comparators. The output signals of the operational amplifiers 16 and 17 are latched in a latch circuit 18. One of the latched output signals of the operational amplifiers 16 and 17 is externally output as an oscillation output signal Vout of the VCO, and the other latched output signal is sued to control the ON/OFF of switches SW1 and SW2.

FIG. 1B is a waveform diagram showing an operation of the VCO shown in FIG. 1A. When the voltage Va of the node n1 becomes higher than the low-level reference voltage Vrl, the latch circuit 18 outputs the high-level signal, which is applied to the switch SW1 and is applied to the switch SW2 via an inverter 20. Hence, the switch SW1 is closed and the switch SW2 is opened. Thus, the capacitor C connected between the node n1 and the ground is charged through the transistor 14. When the voltage Va reaches the high-level reference voltage Vrh, the latch circuit 18 outputs a low-level output signal, by which signal the switch SW1 is opened and the switch SW2 is closed. Thus, the charge stored in the capacitor C flows to the ground through the transistor 15. That is, the capacitor C is discharged.

The oscillation cycle T of the above VCO is expressed as follows:

$$T \propto [(Vrh-Vrl)RC]/Vin.$$

It can be seen from the above that the oscillation cycle T is proportional to the product of the resistance R and the capacitance C. In other words, the oscillation frequency of the VCO is inversely proportional to the product of the resistance R and the capacitance C.

FIG. 2 is a circuit diagram of a conventional filter circuit, which is made up of an operational amplifier AMP, resistors R and R1' and a capacitor C. The cutoff frequency fc of the filter circuit shown in FIG. 2 is described as follows:

$$fc=1/(2\pi RC).$$

It can be seen from the above that the cutoff frequency fc is proportional to the reciprocal of the product of the resistance R and the capacitance C.

The VCO shown in FIG. 1A and the filter shown in FIG. 2 have respective characteristics (that is, the oscillation frequency and cutoff frequency) which depend on the precision levels of the resistor R and the capacitor C, because the characteristics depend on the product of the resistance R and the capacitance C. If the resistor R and the capacitor C are realized on a chip by the integrated circuit technology, the resistors R and the capacitors C formed on the respective chips will have different resistance values and different capacitance values. Such a desperation results from an error introduced during the production process. For example, the resistor is realized by implanting ions in a substrate, and the capacitor is realized by using an oxide film. In this case, an error which occurs in the ion implantation, the pattern size, the thickness of the oxide film and so on affects the characteristics of the circuit elements. Hence, the VCO and filter circuits including these circuit elements formed on the chips will have different characteristics. In this case, it is required to select chips which satisfy required characteristics. However, this selecting work is cumbersome in practical use.

SUMMARY OF THE INVENTION

An object of the present invention is to provide a correction circuit which makes it possible to realize a circuit having a highly precise characteristic by using circuit components having characteristic dispersions.

This object of the present invention is achieved by a correction circuit for controlling a correction required circuit, the correction circuit comprising: an oscillator circuit; and a logic circuit which counts an oscillation frequency of the oscillator circuit and thus produces a control signal which causes the oscillator circuit to oscillate at a constant frequency. The control signal changes element values of elements of the oscillator circuit and the correction required circuit so that characteristics of the oscillator circuit and the correction required circuit can be controlled.

The correction circuit may be configured so that the control signal varies a resistance value of an element related to the oscillation frequency of the oscillator circuit and a resistance value of an element related to an operation frequency of the correction required circuit.

The correction circuit may be configured so that the control circuit varies a capacitance value of an element related to the oscillation frequency of the oscillator circuit and a capacitance value of an element related to an operation frequency of the correction required circuit.

The correction circuit may be configured so that: the oscillation frequency of the oscillator circuit depends on a first product of a resistance value of a first provided therein and a capacitance value of a second element provided therein; an operation frequency of the correction required circuit depends on a second product of a resistance value of a third element provided therein and a capacitance value of a fourth element provided therein; and the control signal varies the first and second products.

The correction circuit may be configured so that the logic circuit comprises a counter which counts the oscillation frequency during a given period, and a control circuit which generates the control signal on the basis of a count value of the counter.

The correction circuit may be configured so that the oscillator circuit comprises a voltage-controlled oscillator.

The correction circuit may be configured so that the oscillator circuit comprises a voltage-controlled oscillator, and the correction required circuit comprises another voltage-controlled oscillator.

The correction circuit may be configured so that the oscillator circuit has a configuration identical to that of the correction required circuit.

Another object of the present invention is to provide an electronic device using the above correction circuit.

This object of the present invention is achieved by an electronic device comprising: a chip on which a correction circuit and a correction required circuit controlled by the correction circuit are formed. The correction circuit comprises: an oscillator circuit; and a logic circuit which counts an oscillation frequency of the oscillator circuit and thus produces a control signal which causes the oscillator circuit to oscillate at a constant frequency. The control signal changes element values of elements of the oscillator circuit and the correction required circuit so that characteristics of the oscillator circuit and the correction required circuit can be controlled.

The above object of the present invention is also achieved by an electronic device comprising: first and second voltage-controlled oscillators; a logic circuit which counts an oscillation frequency of the first voltage-controlled oscillator and thus produces a control signal which causes the first and second voltage-controlled oscillators to oscillate at a constant frequency, the control signal changing element values of elements of the first and second voltage-controlled oscillators; and a PLL circuit including the second voltage-controlled oscillator.

The electronic device may be configured so that: the PLL circuit comprises a phase comparator which compares an FM detection input signal and an output signal of the second voltage-controlled oscillator, and a charge pump circuit which is controlled by a signal output by the phase comparator and generates another control signal for controlling the second voltage-controlled oscillator; and an FM detection output signal is the above another control signal.

BRIEF DESCRIPTION OF THE DRAWINGS

Other objects, features and advantages of the present invention will become more apparent from the following detailed description when read in conjunction with the accompanying drawings, in which:

FIG. 7A is a circuit diagram of a variable resistor used in the embodiments of the present invention;

FIG. 7B is a diagram of an operation of the variable resistor shown in FIG. 7A;

DETAILED DESCRIPTION OF THE PREFERRED EMBODIMENTS

Figure 3:
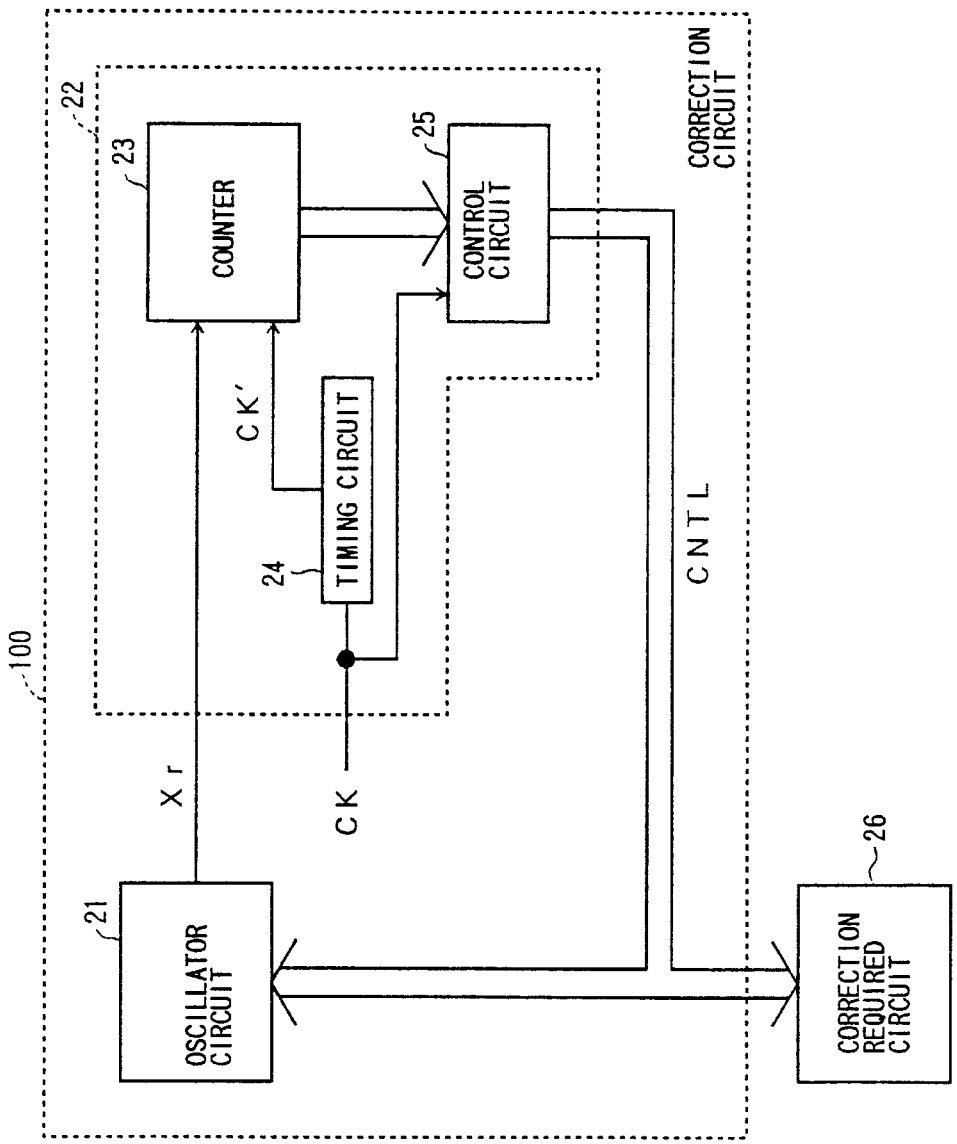
FIG. 3 is a block diagram showing the principle of the present invention.

FIG. 3 is a block diagram showing the principle of the present invention. A correction circuit 100 controls a correction required circuit 26, and includes an oscillator circuit 21, and a logic circuit 22. The oscillator circuit 21 oscillates at a frequency depending on the product of a resistance R and a capacitance C. The logic circuit 22 counts the oscillation frequency Xr, and generates a control signal CNTL depending on the oscillation frequency Xr. The control signal CNTL has, for example, a code formation. The control signal CNTL is applied to the oscillator circuit 21 and the correction required circuit 26. The control signal CNTL functions to change the values of given components (elements) provided in the oscillator circuit 21 and the correction required circuit 26. Hence, the characteristics of the oscillator circuit 21 and the correction required circuit 26 can be changed by the control signal CNTL. More particularly, the resistance value and/or capacitance value of the oscillator circuit 21, and the resistance value and/or capacitance value of the correction required circuit 26 are changed by the control signal CNTL. The correction required circuit 26 is, for example, the VCO shown in FIG. 1A. The oscillator circuit 21 has the same configuration as that of the correction required circuit 26.

Figure 4:
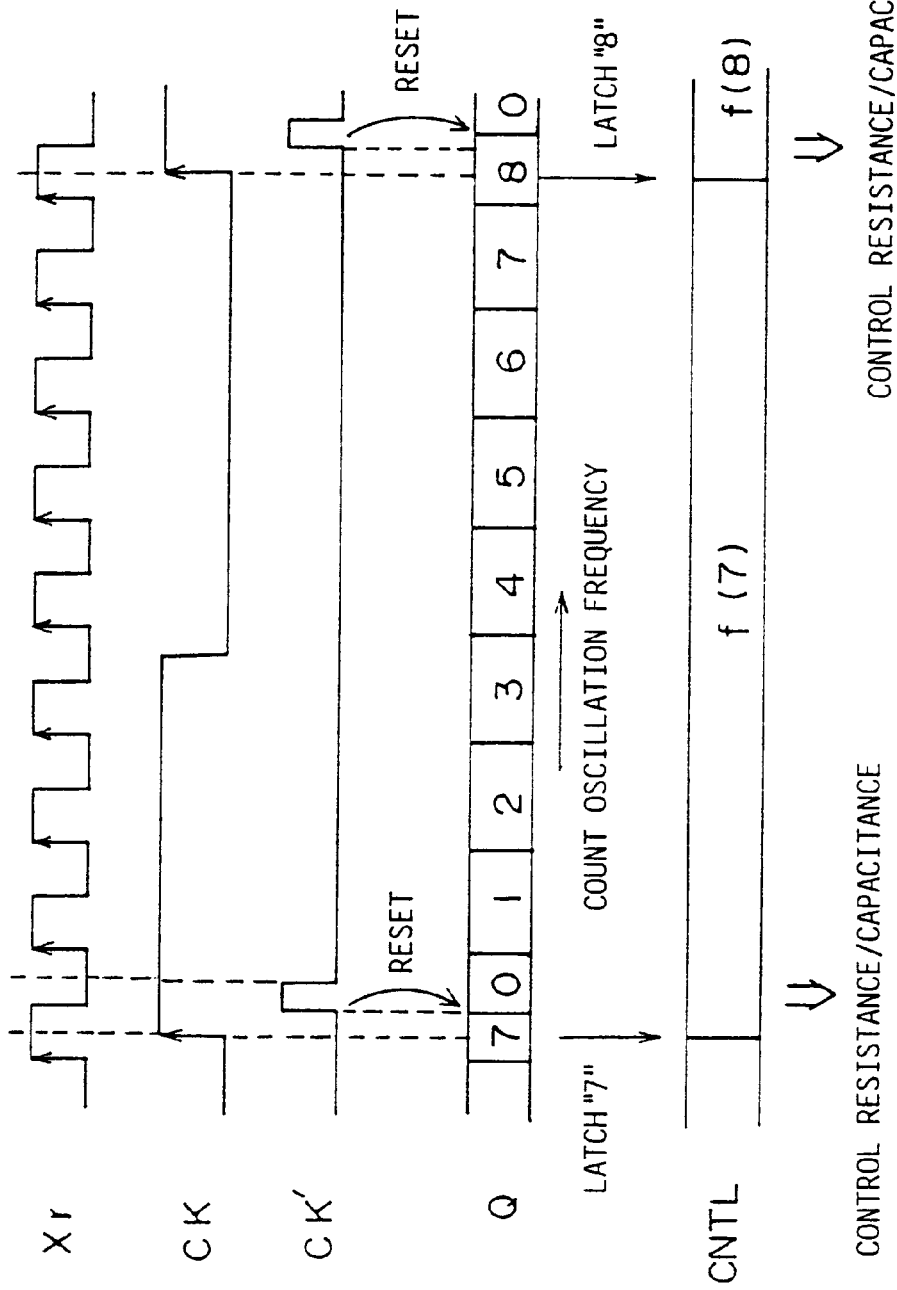
FIG. 4 is a timing chart of an operation of the configuration shown in FIG. 3.

The logic circuit 22 includes a counter 23, a timing circuit 24, and a control circuit 25. As shown in FIG. 4, the timing circuit 24 counts a clock signal CK supplied from the outside of the correction circuit 100, and outputs a resultant pulse signal CK' to the counter 23. The pulse signal CK' indicates each rising edge of the clock signal CK. The counter 23 is reset each time the pulse signal CK' is applied thereto, and continues to count the oscillation frequency Xr during a period, which ends when the counter 23 is reset for the next time. In other words, the counter 23 continuously counts the oscillation frequency Xr for one cycle of the clock signal CK.

The control circuit 25 latches a count value Q obtained at the time when the clock signal CK rises, and outputs, as the control signal CNTL, a control code corresponding to the latched count value Q to the oscillator circuit 21 and the correction required circuit 26. In the case shown in FIG. 4, the control circuit 25 latches-the count value Q equal to 7 and outputs a corresponding control code f(7). In synchronism with the next rising edge of the clock signal CK, the control circuit 25 latches the count value Q equal to 8 and outputs a corresponding control code f(8). The element values of the given components of the oscillator circuit 21 and the correction required circuit 26 can be changed in accordance with the received control code. The above element values correspond to, for example, the products of the resistance value and the capacitance value. Hence, the oscillation frequency of the oscillator circuit 21 is controlled so as to be constant, and simultaneously the characteristic of the correction required circuit 26 (which corresponds to the oscillation frequency) is controlled so as to be constant.

Even if the components of the oscillator circuit 21 and the correction required circuit 26 have errors of the absolute precision levels thereof, the characteristic of the correction required circuit 26 can be kept constant by controlling the oscillation frequency of the oscillator circuit 21 to be constant. For example, if the oscillator circuit 21 and the correction required circuit 26 are formed on an identical chip, a degradation of the absolute precision of the components of the oscillator circuit 21 will coincide with that of the absolute precision of the components of the correction required circuit 26 because these components are produced by the same production process. Hence, there is no change of the relative precision of the components between the oscillator circuit 21 and the correction required circuit 26.

Figure 5:
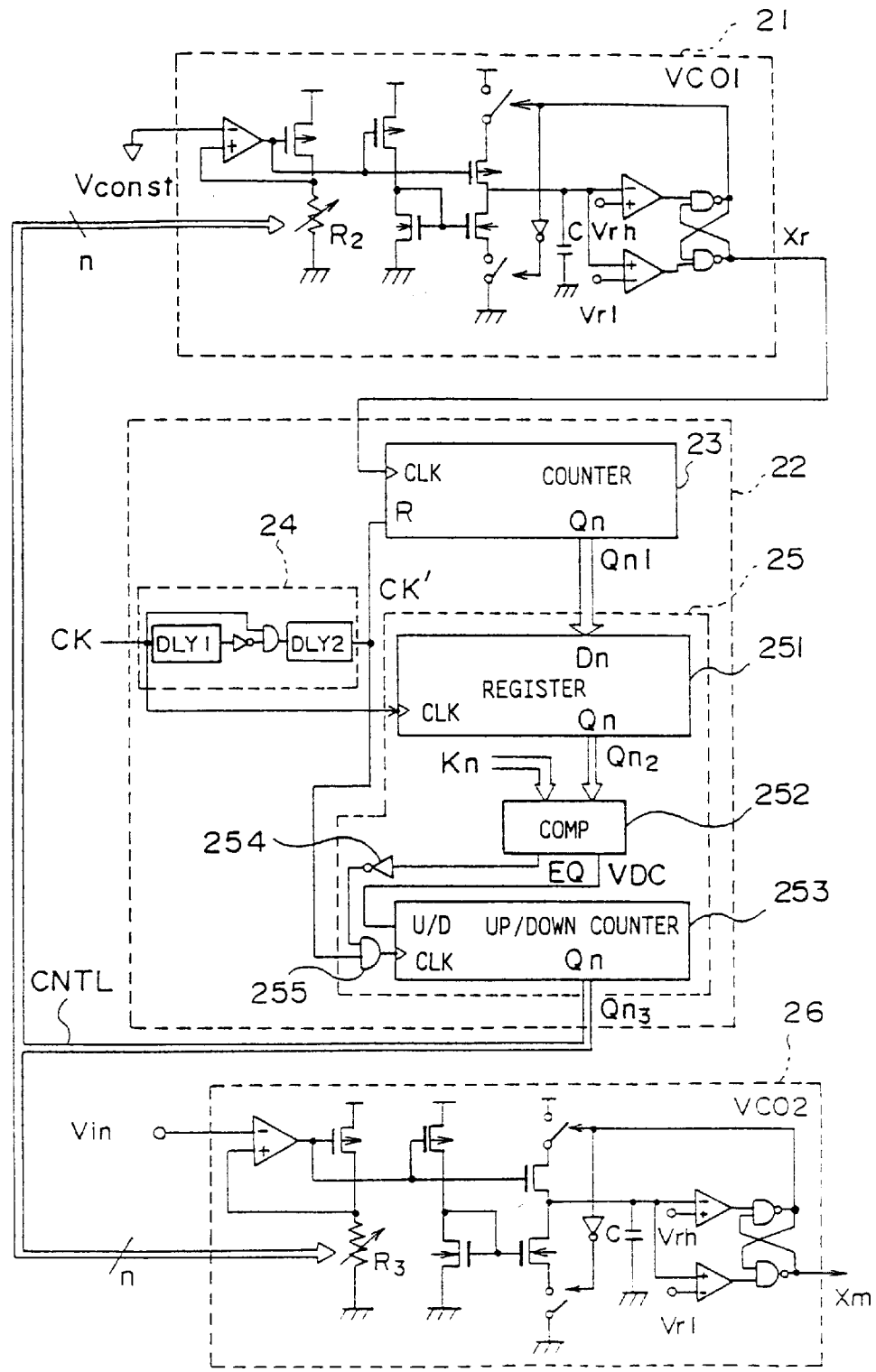
FIG. 5 is a block diagram of a first embodiment of the present invention.

FIG. 5 is a block diagram of a first embodiment of the present invention, in which parts that are the same as those shown in FIG. 3 are given the same reference numbers.

Figure 1A:
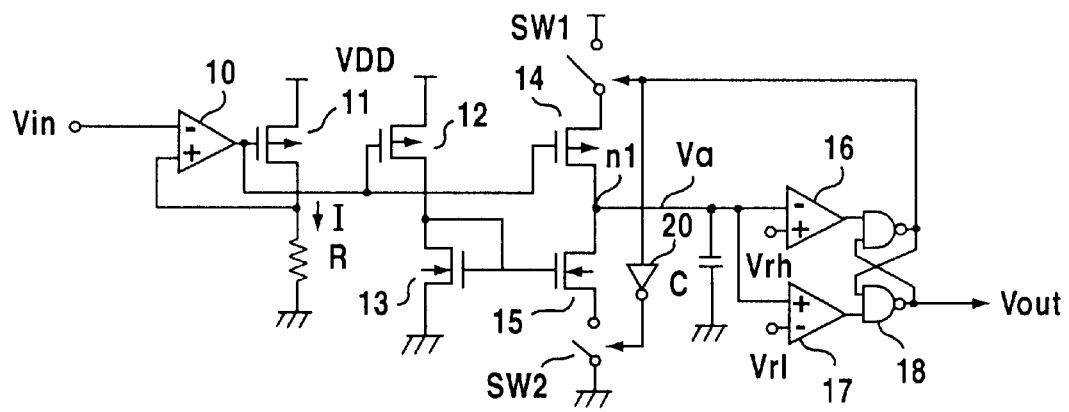
FIG. 1A is a circuit diagram of a conventional VCO.
Figure 1B:
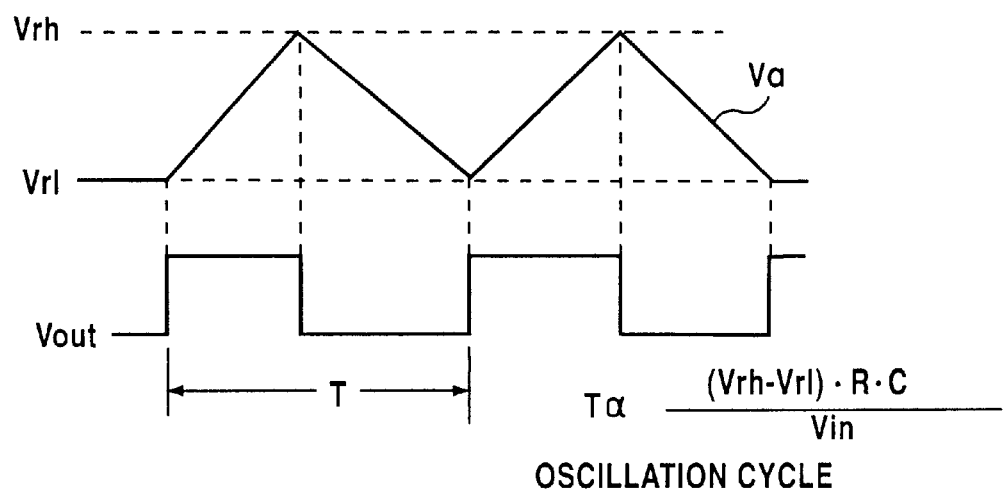
FIG. 1B is a waveform diagram of an operation of the VCO shown in FIG. 1A.
Figure 2:
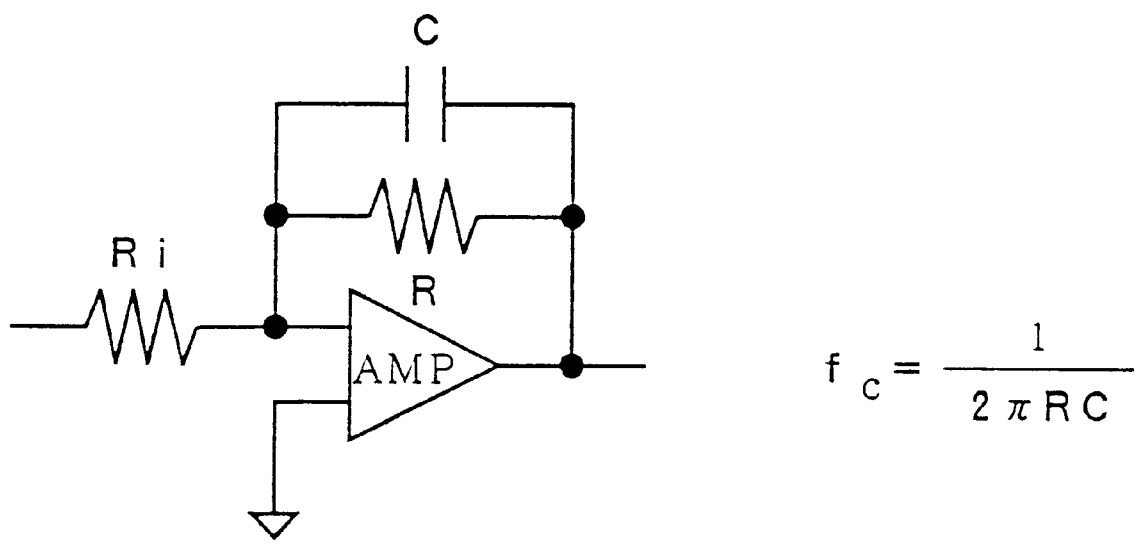
FIG. 2 is a circuit diagram of a conventional filter.

The oscillator circuit 21 has the same configuration as the correction required circuit 26, and is the same as shown in FIG. 1A. That is, the correction required circuit 26 is configured as shown in FIG. 1A. Hereinafter, the oscillator circuit 21 is referred to as VCO1 and the correction required circuit 26 is referred to as VCO2. The resistor R shown in FIG. 1A has a fixed resistance value. The VCO1 has a variable resistor R2 substituted for the fixed resistor R, and the VCO2 has a variable resistor R3 substituted for the fixed resistor R, as shown in FIG. 5. An input voltage applied to the VCO1 is a constant voltage Vconst. The logic circuit 22 controls the VCO1 so that the oscillation frequency thereof becomes equal to a frequency depending on the constant voltage Vconst. Hence, the oscillation frequency of the VCO2 becomes equal to that of the VCO1 when an input voltage Vin applied to the VCO2 is equal to the constant voltage Vconst.

The counter 23 of the logic circuit 22 receives the oscillation frequency Xr of the VCO1 via a clock terminal CLK, and the pulse signal CK' from the timing circuit 24 via a reset terminal R. The counter 23 counts the oscillation frequency Xr (that is, the number of pulses thereof) until it is reset again (that is, during the cycle of the clock signal CK). Then, the counter 23 outputs the count value to the control circuit 25 as a signal Qn1. The timing circuit 24 includes two delay circuits DLY1 and DLY2, an inverter and an AND gate. Thus, the timing circuit 24 detects each rising edge of the clock signal CK, and thus produce the pulse signal CK' having a given delay. The pulse signal CK' is applied to the reset terminal R of the counter 23 and the control circuit 25.

The control circuit 25 includes a register 251, a comparator 252, an up/down counter 253, an inverter 254 and an AND gate 255. The register 251 latches the output signal Qn1 of the counter 23 via an input terminal Dn in synchronism with the rising edge of the clock signal CK. The latched count value Qn1 is immediately output, as an output signal Qn2, via an output terminal Qn of the register 251. The comparator 252 compares the count value Qn2 with a constant number Kn, and outputs an up/down count instruction signal UDC based on the comparison result to an up/down count instruction terminal U/D of the up/down counter 253.

When the count value Qn2 is equal to the constant number Kn, the comparator 252 outputs an equality signal EQ. The inverter 254 outputs the inverted version of the equality signal EQ to the AND gate 255. The AND gate 255 performs an AND operation on the output signal of the inverter 254 and the pulse signal CK'. That is, when the equality signal EQ is output by the comparator 252 (in other words, when the equality signal EQ becomes high), the AND gate 255 prevents the pulse signal CK' from passing therethrough. The up/down counter 253 counts up or down the pulse signal CK' in accordance with the up/down count instruction signal UDC, and outputs a resultant count value Qn3 as the aforementioned control signal CNTL. The resistance values of the variable resistors R2 and R3 are changed in accordance with the count value Qn3.

Figure 6:
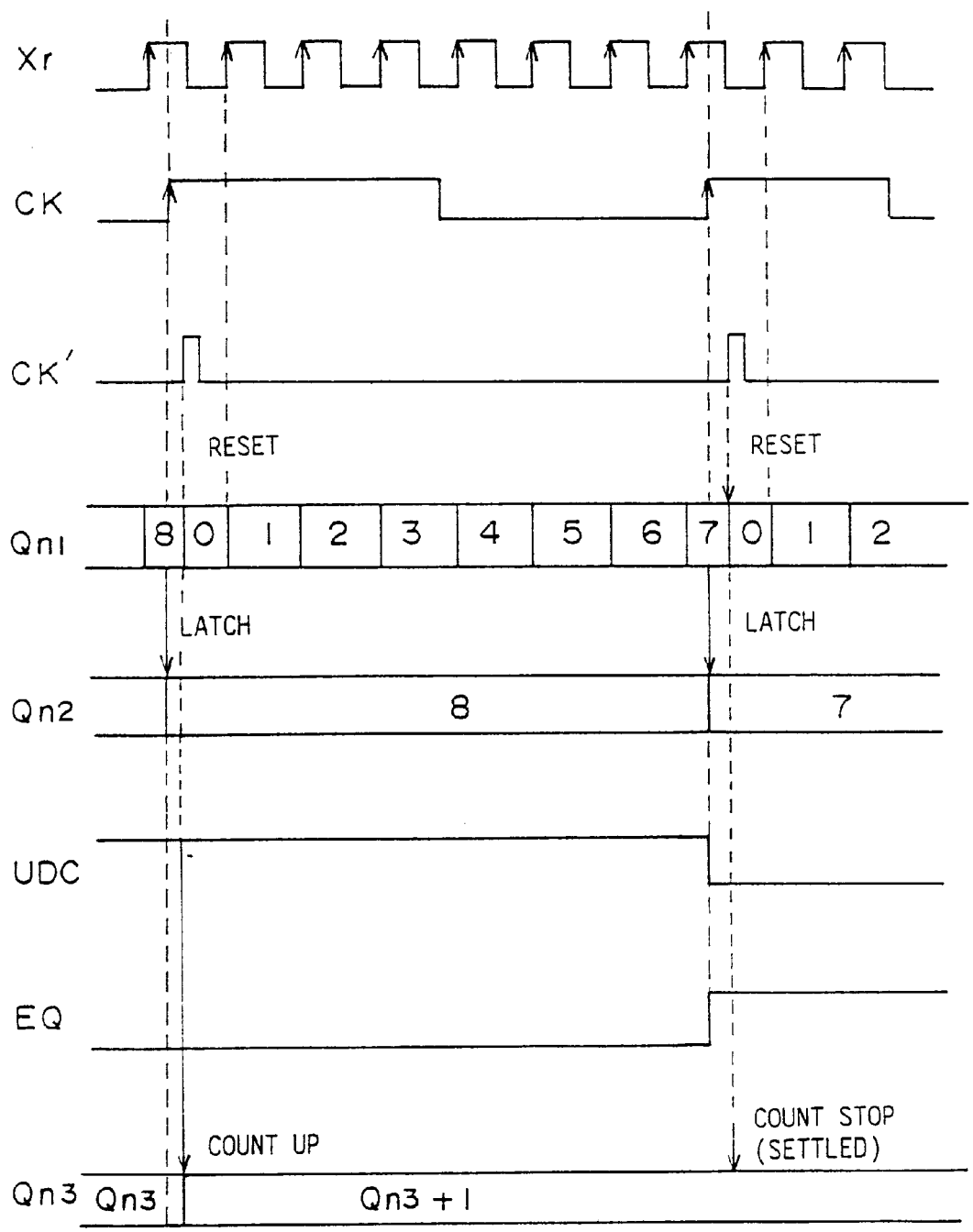
FIG. 6 is a timing chart of an operation of the first embodiment of the present invention.

FIG. 6 is a timing chart of the operation of the first embodiment of the present invention shown in FIG. 5. During one cycle of the clock signal CK, the counter 23 counts the number of pulses of the oscillation frequency Xr output by the VCO1, and outputs the count value Qn1. The register 251 latches the count value Qn1 in synchronism with the clock signal CK, so that the count value Qn2 can be obtained. Immediately after the above latch operation, the reset signal CK' is applied to the counter 23, which is thus reset. The comparator 252 compares the count value Qn2 with the constant number Kn. The comparison result determines whether the up/down counter 253 should operate as the up counter or the down counter. The up or down count operation is carried out in synchronism with the rising edge of the pulse signal CK'. The count value Qn3 of the up/down counter 253 controls the resistance value of the variable resistor R2 and the resistance value of the variable resistor R3. Thus, the oscillation frequencies of the VCO1 and VCO2 are changed.

In FIG. 6, when Qn2 is equal to 8, which is greater than the constant number Kn is 7, the up count operation is instructed by the signal UDC. Thus, the up/down counter 253 counts up the count value by 1 so that the count value Qn3+1 is output therefrom. In this case, the oscillation frequencies of the VCO1 and VCO2 are controlled to be reduced by the variable resistors R2 and R3. Then, the latched count value Qn2 becomes equal to 7. In this case, the equality signal EQ is activated, and the up/down counter 253 is caused to stop the count operation.

The above operation is repeatedly carried out, so that the oscillation frequencies of the VCO1 and VCO2 are settled to the given frequency.

FIG. 7A is a circuit diagram of a configuration of each of the variable resistors R2 and R3. The variable resistor R2

(R3) includes resistors R11 through R18 connected in series, switches S1 through S8, a group 41 of NOR gates, and a group 42 of inverters. A node n2 is connected to the noninverting input terminal of the operational amplifier located on the input side of the VCO1 (VCO2). The output signal Qn3 of the up/down counter 253 consists of three bits Q0, Q1 and Q2. The three bits Q0, Q1 and Q2 are directly applied to the group 41 of NOR gates or are applied thereto via the group 42 of inverters. Eight bits forming an output signal of the group 41 of NOR gates respectively control the ON/OFF switching operations of the corresponding switches S1–S8.

FIG. 7B shows the relationship among the values of Q0–Q2, the ON/OFF states of the switches S1–S8 and resistance values thus obtained. The three bits Q0–Q2 are decoded by the group 42 of inverters and the group 41 of NOR gates, so that only one of the switches is turned ON. For example, when Q0=Q1=Q2=0, then only the switch S1 is turned ON, and the variable resistor has a resistance value R11.

Figure 8:
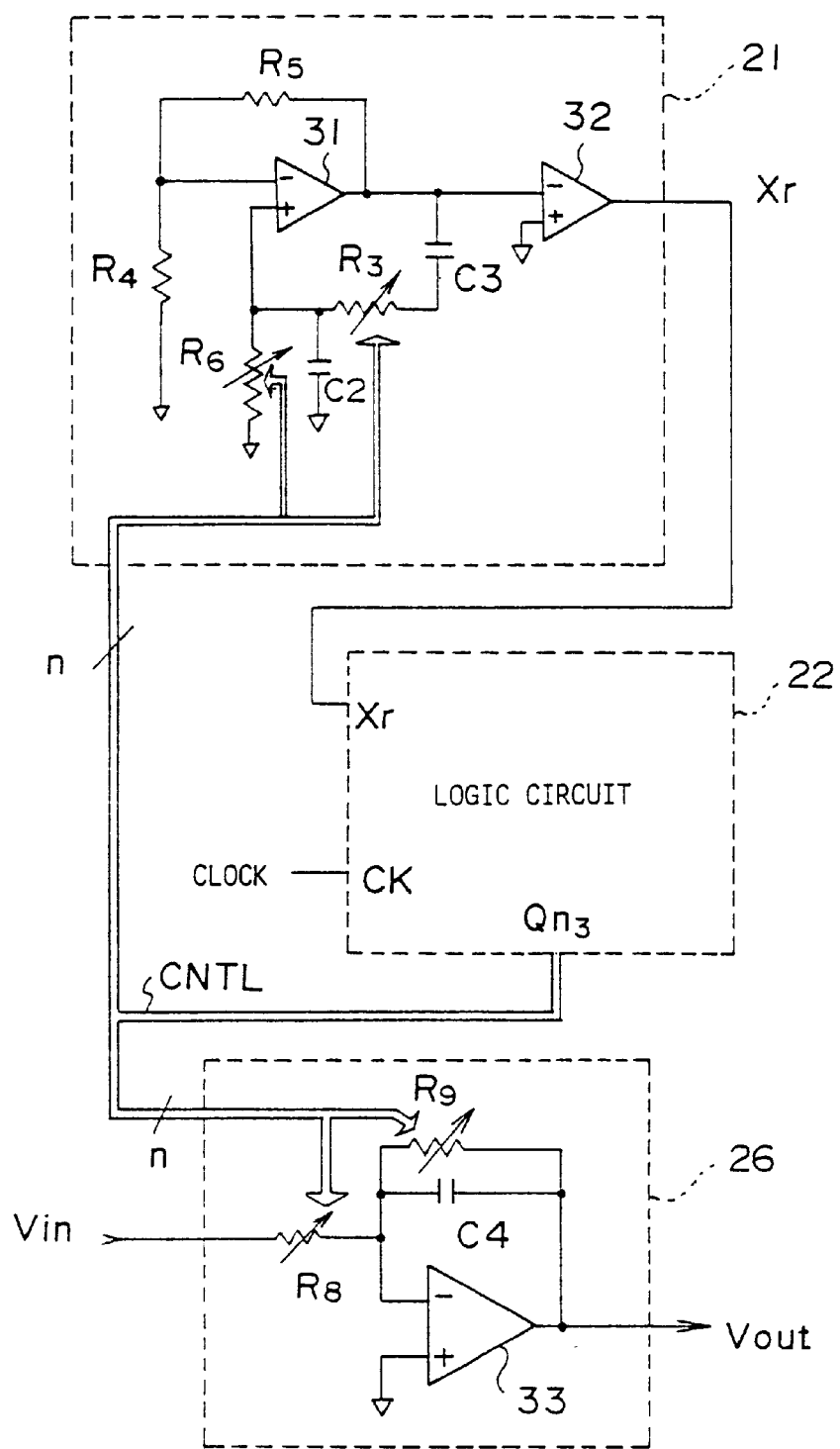
FIG. 8 is a block diagram of a second embodiment of the present invention.

A description will now be given of a second embodiment of the present invention with reference to FIG. 8. In the second embodiment of the present invention, the oscillator circuit 21 is formed of a Wien bridge oscillation circuit, and the correction required circuit 26 is a primary (first-order) filter. The logic circuit 22 is configured as shown in FIG. 5.

The oscillator circuit 21 includes operational amplifiers 31 and 32, resistors R4 and R5, variable resistors R6 and R7 and capacitors C2 and C3. The oscillation frequency of the oscillator circuit 21 is determined by the resistance values of the variable resistors R6 and R7 and the capacitance values of the capacitors C2 and C3. The control signal CNTL(Qn3) output by the logic circuit 22 varies the resistance values of the variable resistors R6 and R7 so that the oscillation frequency is constant.

The correction required circuit 26 includes an operational amplifier 33, variable resistors R8 and R9, and a capacitor C4. The cutoff frequency of the correction required circuit 26 is determined by the resistance value of the variable resistor R9 and the capacitance value of the capacitor C4. When the cutoff frequency is changed, the gain of the correction required circuit 26 is also changed. With the above in mind, the resistance value of the variable resistor R8 is simultaneously controlled so that the gain is constant. Signal components having frequencies lower than the cutoff frequency of the input signal Vin are output as an output signal Vout. The variable resistors R6 through R9 can be configured as shown in FIGS. 7A and 7B.

Figure 9:
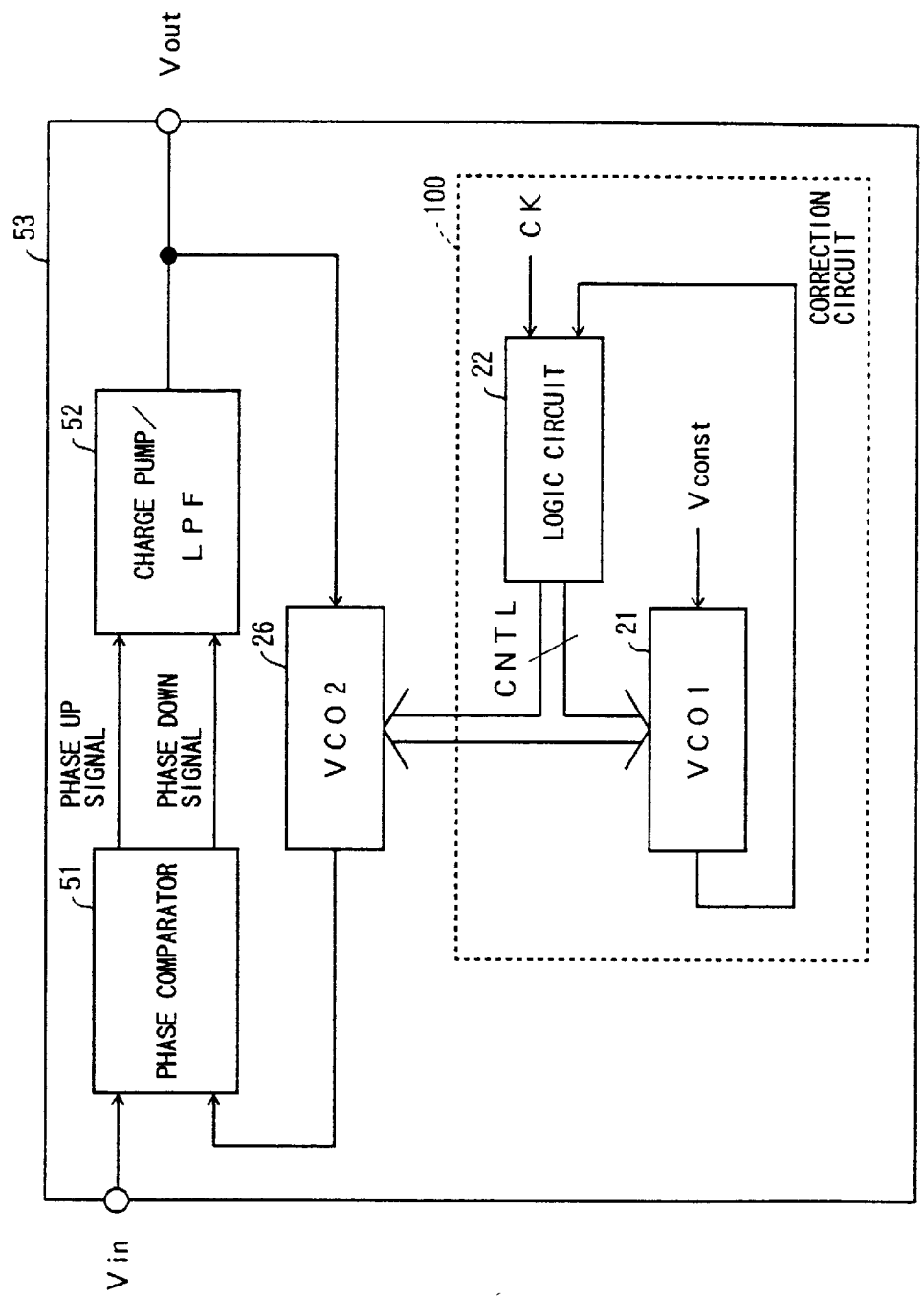
FIG. 9 is a block diagram of an electronic device equipped with the correction circuit of the present invention.

FIG. 9 is a block diagram of a semiconductor integrated circuit device equipped with the correction circuit 100. The device shown in FIG. 9 has a semiconductor chip 53 on which an FM detection circuit is formed. The VCO2 which is the correction required circuit forms a PLL circuit together with a phase comparator 51 and a charge pump/LPF 52. The phase comparator 51 compares the phase of the input signal Vin with the output signal of the VCO2, and outputs a phase up signal and a phase down signal to the charge pump/LPF 52 on the basis of the comparison results. The charge pump/LPF 52 performs a charge pump operation in accordance with the phase up/down signals, and outputs a resultant control voltage to the VCO2 via the LPF part thereof. The control voltage thus produced controls the oscillation frequency of the VCO2. The control voltage depends on the frequency of the input signal Vin, and is thus output as an FM detection output signal. The product of the resistance value and the capacitance value related to the oscillation frequency of the VCO2 are controlled by the control signal CNTL output by the correction circuit 100. Hence, the VCO1 and VCO2 oscillate at an identical oscillation frequency dependent on the constant voltage Vconst. As a result, even if the VCO1 and VCO2 have components having precision levels deviating from the absolute precision levels thereof, the VCO1 and VCO2 are not affected by such deviations. Hence, the FM detection circuit of a highly precise FM detection characteristic can be realized.

Figure 10:
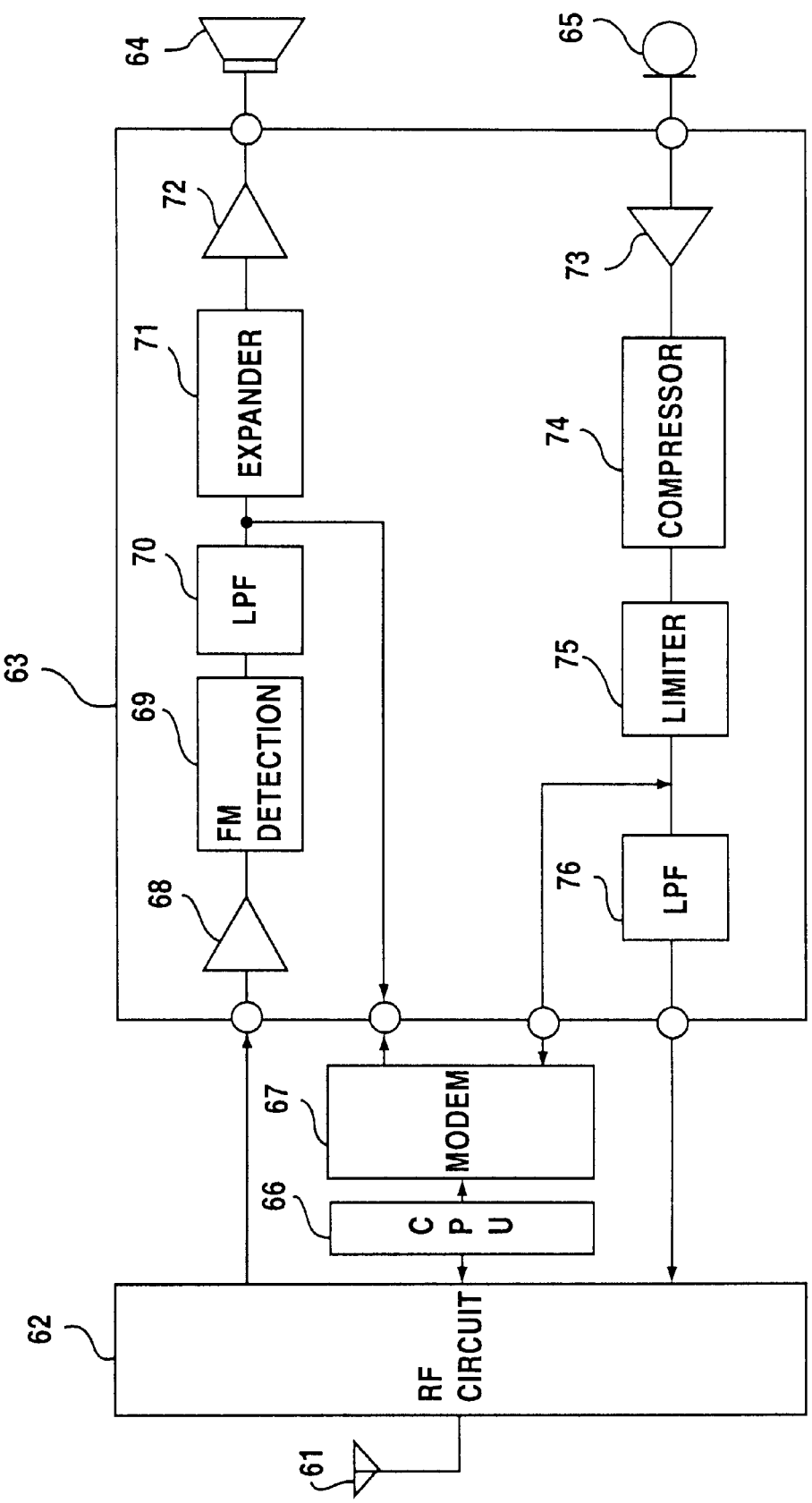
FIG. 10 is a block diagram of a cordless telephone set equipped with the electronic device shown in FIG. 9.

FIG. 10 is a block diagram of a cordless telephone set equipped with the FM detection circuit shown in FIG. 9. The cordless telephone set shown in FIG. 10 includes an antenna 61, an RF circuit 62, an LSI device 63 for a cordless telephone, a receiver (speaker) 64, a microphone 65, a CPU 66 and a modem 67. The LSI chip 63 includes an FM detection circuit 69 configured as shown in FIG. 9. The LSI device 63 has the chip 53 shown in FIG. 9, on which there are formed, in addition to the FM detection circuit 69, an IF amplifier 68, a LPF 70, an expander 71, a drive amplifier 72, an amplifier 73, a compressor 74, a limiter 75 and a LPF 76. These circuit elements formed on the LSI are conventional other than the FM detection circuit 69 configured as shown in FIG. 9.

A voice signal received via the antenna 61 is output to the receiver 64 via the RF circuit 62, the IF amplifier 68, the FM detection circuit 69, the LPF 70, the expander 71 and the drive amplifier 72. A data signal received via the antenna 61 is applied to the CPU 67 via the LPF 70 and the modem 67. A voice signal from the microphone 65 to be transmitted passes through the amplifier 73, the compressor 74, the limiter 75 and the LPF 76, and is then transmitted via the RF circuit 62 and the antenna 61. A data signal from the CPU 67 to be transmitted passes through the modem 67 and the LPF 76, and is then transmitted via the RF circuit 62 and the antenna 61.

The present invention is not limited to the specifically disclosed embodiments, and variations and modification can be made without departing from the scope of the present invention.

The oscillator circuit 21 is not limited to the VCO and Wien bridge RC oscillator circuit, but may be formed of another circuit configuration using a resistor and a capacitor. The component to be controlled by the control signal CNTL is not limited to the resistors, but may be a capacitor or both of a resistor and a capacitor. It may be easier to control the resistor if the resistor is integrally formed on a chip. The correction circuit is not limited to the configuration shown in FIG. 5, but may be realized in an arbitrary manner capable of producing the control signal CNTL dependent on the oscillation frequency of the oscillator circuit 21. The correction required circuit is not limited to the oscillator circuit and filter, but may be a circuit which employs a resistor and a capacitor.

What is claimed is:

1. A correction circuit for controlling a correction required circuit, said correction circuit comprising:
   an oscillator circuit; and
   a logic circuit which counts an oscillation frequency of the oscillator circuit and thus produces a digital control signal which causes the oscillator circuit to oscillate at a constant frequency,
   the digital control signal discretely changing element values in steps of elements of the oscillator circuit and the correction required circuit so that characteristics of the oscillator circuit and the correction required circuit can be controlled, and the correction required circuit can be controlled, wherein said digital control signal varies one of a resistance value and a capacitance value of an element related to the oscillation frequency of the oscillator circuit and one of a resistance value and a capacitance value of an element related to an operation frequency of the correction required circuit.

2. The correction circuit as claimed in claim 1, wherein:

the oscillation frequency of the oscillator circuit depends on a first product of a resistance value of a first provided therein and a capacitance value of a second element provided therein;

an operation frequency of the correction required circuit depends on a second product of a resistance value of a third element provided therein and a capacitance value of a fourth element provided therein; and the control signal varies the first and second products.

3. The correction circuit as claimed in claim 1, wherein the logic circuit comprises a counter which counts the oscillation frequency during a given period, and a control circuit which generates the control signal on the basis of a count value of the counter.

4. The correction circuit as claimed in claim 1, wherein the oscillator circuit comprises a voltage-controlled oscillator.

5. The correction circuit as claimed in claim 1, herein the oscillator circuit comprises a voltage-controlled oscillator, and the correction required circuit comprises another voltage-controlled oscillator.

6. The correction circuit as claimed in claim 1, wherein the oscillator circuit has a configuration identical to that of the correction required circuit.

7. The correction circuit of claim 1, wherein said control signal changes said element values such that the ratio of $V_{in}/f_0$ is controlled, where $V_{in}$ is an arbitrary voltage applied to a control input of the oscillator circuit or the correction required circuit and $f_0$ is the frequency of the output signal of the respective circuit generated in response to $V_{in}$.

8. An electronic device comprising:

a chip on which a correction circuit and a correction required circuit controlled by the correction circuit are formed, said correction circuit comprising:

an oscillator circuit; and a logic circuit which counts an oscillation frequency of the oscillator circuit and thus produces digital a control signal which causes the oscillator circuit to oscillate at a constant frequency, the digital control signal discretely changing element values in steps of elements of the oscillator circuit and the correction required circuit so that characteristics of the oscillator circuit and the correction required circuit can be controlled, wherein said digital control signal varies one of a resistance value and a capacitance value of an element related to the oscillation frequency of the oscillator circuit and one of a resistance value and a capacitance value of an element related to an operation frequency of the correction required circuit.

9. The electronic device of claim 8, wherein said control signal changes said element values such that the ratio of $V_{in}/f_0$ is controlled, where $V_{in}$ is an arbitrary voltage applied to a control input of the oscillator circuit or the correction required circuit and $f_0$ is the frequency of the output signal of the respective circuit generated in response to $V_{in}$.

10. An electronic device comprising:

first and second voltage-controlled oscillators;

a logic circuit which counts an oscillation frequency of the first voltage-controlled oscillator and thus produces a digital control signal which causes the first and second voltage controlled oscillators to oscillate at a constant frequency, the digital control signal discretely changing element values in steps of elements of the first and second voltage-controlled oscillators; and a phase-locked loop (PLL) circuit including the second voltage-controlled oscillator, wherein said digital control signal varies one of a resistance value and a capacitance value of an element related to the oscillation frequency of the oscillator circuit and one of a resistance value and a capacitance value of an element related to an operation frequency of the correction required circuit.

11. The electronic device as claimed in claim 10, wherein:

the PLL circuit comprises a phase comparator which compares an FM detection input signal and an output signal of the second voltage-controlled oscillator, and a charge pump circuit which is controlled by a signal output by the phase comparator and generates another control signal for controlling the second voltage-controlled oscillator; and an FM detection output signal is said another control signal.

12. The electronic device of claim 10, wherein said control signal changes said element values such that the ratio of $V_{in}/f_0$ is controlled, where $V_{in}$ is an arbitrary voltage applied to a control input of the oscillator circuit or the correction required circuit and $f_0$ is the frequency of the output signal of the respective circuit generated in response to $V_{in}$.

* * * * *